(12) United States Patent
Kalia et al.

(10) Patent No.: US 11,368,124 B1
(45) Date of Patent: Jun. 21, 2022

(54) OSCILLATOR WITH BULK-ACOUSTIC WAVE (BAW) RESONATOR AND SERIES-RESONANCE TOPOLOGY

(71) Applicant: Texas Instruments Incorporated, Dallas, TX (US)

(72) Inventors: Sachin Kalia, Dallas, TX (US); Tolga Dinc, Dallas, TX (US); Bichoy Bahr, Allen, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/189,556

(22) Filed: Mar. 2, 2021

(51) Int. Cl.
*H03B 5/32* (2006.01)
*H03H 9/17* (2006.01)
*H03L 7/099* (2006.01)

(52) U.S. Cl.
CPC .............. *H03B 5/326* (2013.01); *H03H 9/17* (2013.01); *H03L 7/099* (2013.01)

(58) Field of Classification Search
CPC ........... H03B 5/326; H03L 7/099; H03H 9/17
See application file for complete search history.

(56) References Cited

U.S. PATENT DOCUMENTS

| 7,002,423 B1 * | 2/2006 | Drakhlis | H03B 5/06 331/158 |
|---|---|---|---|
| 2011/0018649 A1 * | 1/2011 | David | H03B 5/1243 331/158 |

* cited by examiner

*Primary Examiner* — Jeffrey M Shin
(74) *Attorney, Agent, or Firm* — Michael T. Gabrik; Charles A. Brill; Frank D. Cimino (57) ABSTRACT

An oscillator includes: a bulk-acoustic wave (BAW) resonator having a first BAW resonator terminal and a second BAW resonator terminal; and an active circuit coupled to the first and second BAW resonator terminals and having a series resonance topology with: a first transistor; a second transistor; a first resistor; a second resistor; a capacitive network coupled to first and second BAW resonator terminals and to respective current terminals of the first and second transistors; and an inductor having a first inductor terminal and a second inductor terminal, the first inductor terminal coupled to the capacitive network, and the second inductor terminal coupled to ground terminal.

20 Claims, 7 Drawing Sheets

OSCILLATOR WITH BULK-ACOUSTIC WAVE (BAW) RESONATOR AND SERIES-RESONANCE TOPOLOGY

BACKGROUND

As new electronic devices are developed and integrated circuit ("IC") technology advances, new IC products are commercialized. One example IC product for electronic devices is an oscillator. A conventional oscillator circuit generates signal(s) with different resonant frequencies. In addition to including one or more inductors and capacitors, conventional oscillators include a power supply and active circuit to replenish energy due to losses in the oscillator circuit. Different oscillator circuits vary with regard to topology, power consumption, resonant frequencies, quality factor, phase noise, and other parameters. One type of oscillator includes a bulk-acoustic wave (BAW) resonator or microelectromechanical system (MEMS) resonator coupled to an active circuit. Flicker noise (such as, 1/f noise and colored noise) in active devices used in voltage controller oscillators gets up-converted around the oscillation frequency thereby degrading close-in phase noise. This is particularly an issue for close-in frequency offsets (e.g., 1 Hz, 10 Hz, 100 Hz).

SUMMARY

In at least one example, an oscillator comprises: a bulk-acoustic wave (BAW) resonator having a first BAW resonator terminal and a second BAW resonator terminal; and an active circuit coupled to the first and second BAW resonator terminals and having a series resonance topology. The series resonance topology includes: a first transistor having a first current terminal, a second current terminal and a first control terminal, the first current terminal coupled to a voltage supply terminal, and the control terminal coupled to the first BAW resonator terminal; a second transistor having a third current terminal, a fourth current terminal and a second control terminal, the third current terminal coupled to the voltage supply terminal, and the second control terminal coupled to the second BAW resonator terminal; a first resistor having a first resistor terminal and a second resistor terminal, the first resistor terminal coupled to the second current terminal, and the second resistor terminal coupled to a ground terminal; a second resistor a third resistor terminal and a fourth resistor terminal, the third resistor terminal coupled to the fourth current terminal, and the fourth resistor terminal coupled to the ground terminal; a capacitive network coupled to the first and second BAW resonator terminals, the second current terminal, and the fourth current terminal; and an inductor having a first inductor terminal and a second inductor terminal, the first inductor terminal coupled to the capacitive network, and the second inductor terminal coupled to ground terminal.

In another example, a system comprises circuitry having a clock input; and an oscillator having a clock output coupled to the clock input of the circuitry. The oscillator has: a BAW resonator having a first BAW resonator terminal and a second BAW resonator terminal; and an active circuit coupled to the first and second BAW resonator terminals and having a series resonance topology. The series resonance topology includes: a first transistor having a first current terminal, a second current terminal and a first control terminal, the first current terminal coupled to a voltage supply terminal, and the control terminal coupled to the first BAW resonator terminal; a second transistor having a third current terminal, a fourth current terminal and a second control terminal, the third current terminal coupled to the voltage supply terminal, and the second control terminal coupled to the second BAW resonator terminal; a first resistor having a first resistor terminal and a second resistor terminal, the first resistor terminal coupled to the second current terminal, and the second resistor terminal coupled to a ground terminal; a second resistor a third resistor terminal and a fourth resistor terminal, the third resistor terminal coupled to the fourth current terminal, and the fourth resistor terminal coupled to the ground terminal; a capacitive network coupled to the first and second BAW resonator terminals, the second current terminal, and the fourth current terminal; and an inductor having a first inductor terminal and a second inductor terminal, the first inductor terminal coupled to the capacitive network, and the second inductor terminal coupled to ground terminal.

BRIEF DESCRIPTION OF THE DRAWINGS

The same reference numbers are used in the drawings to depict the same or similar features.

DETAILED DESCRIPTION

In this description, an oscillator includes a bulk-acoustic wave (BAW) resonator and an active circuit with features to deliver ultra-flow flicker noise performance at close-in frequency offsets (e.g., 10 Hz, 100 Hz, and 1 kHz). With ultra-flow flicker noise performance at close-in frequency offsets, the phase noise of the oscillator is reduced, which is an important performance metric for seismic clocks, atomic clocks, or other time references for use with a Global System for Mobile Communications (GSM) satellite or other applications that rely on long term stability, low drift time references. As used herein, "close-in frequency offsets" refers to sub parts-per-million (ppm) offsets. For example, at 2.5 GHz, offsets below 2.5 kHz are close-in frequency offsets.

In some example embodiments, the active circuit includes a bipolar junction transistor (BJT)-based differential series topology with large devices to limit series capacitive reactance and lower inherent flicker. In some example embodiments, the device size is selected to be as large as possible subject to constraints such as power consumption, area overhead, distributed impedance targets, or other practical constraints. In some example embodiments, the active circuit includes split inductive and resistive degeneration, for flicker suppression and suppression through fine phase alignment between base and emitter voltages. In some example embodiments, the active circuit includes a large common-mode direct-current (DC) biasing inductor, which allows for a single common signal electrostatic discharge (ESD) between transistor base terminals without affecting the oscillation frequency.

Figure 1:
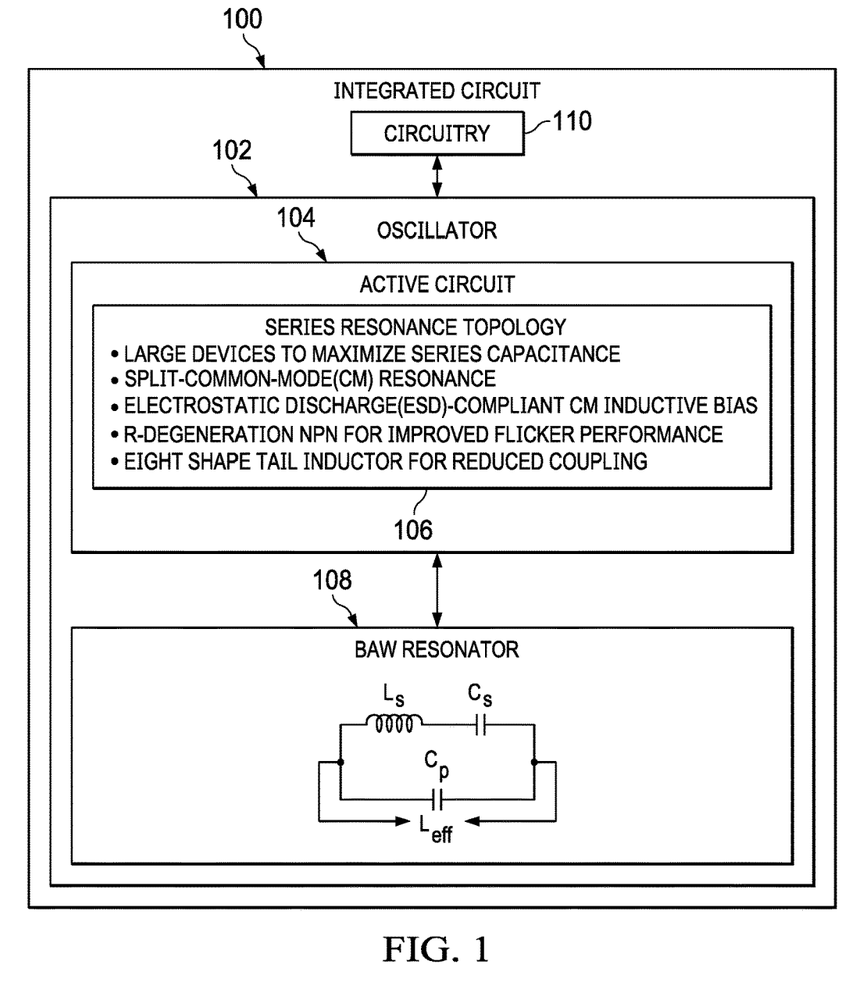
FIG. 1 is a block diagram of an integrated circuit in accordance with an example embodiment.

FIG. 1 is a block diagram of an integrated circuit 100 in accordance with an example embodiment. As shown, the integrated circuit 100 includes an oscillator 102 coupled to circuitry 110. In one example, oscillator 102 provides a reference signal and the circuitry 110 includes phase-locked loops (PLLs) or other timing circuitry that rely on the reference signal from the oscillator. In some example embodiments, the reference signal from the oscillator 102 is a radio frequency (RF) signal (e.g., in the several GHz range). In the example of FIG. 1, the oscillator 102 includes an active circuit 104 coupled to a BAW resonator 108. The BAW resonator 108 is modeled in FIG. 1 as an equivalent circuit with a series inductor Ls and capacitor Cs and a parallel capacitor ($C_p$) as shown. In operation, the BAW resonator 108 provides first and second resonant frequencies (e.g., 2.5 GHz and 2.533 GHz). More specifically, the BAW resonator 108 behaves like an effective inductor ($L_{eff}$) with inductance ranging from 0 to ∞ between the frequency interval spanning the first resonant frequency (a series resonance $\omega_s$) and the second resonant frequency (a parallel resonance $\omega_p$).

In some example embodiments, the equivalent circuit used to model the BAW resonator 108 in FIG. 1 has the following characteristics:

$$\omega_s = \frac{1}{\sqrt{L_s C_s}}; \omega_p = \frac{1}{\sqrt{L_s \frac{C_s C_p}{C_s + C_p}}}; \text{ and}$$

$$L_{eff}(\omega) = \frac{\left(\frac{\omega}{\omega_s}\right)^2 - 1}{\omega^2 (C_s + C_p)\left[1 - \left(\frac{\omega}{\omega_p}\right)^2\right]},$$

The effective inductance, $L_{eff}$ expression is used here to explain the concept behind using the BAW resonator in an oscillator. Between the series and the parallel resonance frequencies (the series resonance frequency being lower in frequency than the parallel resonance frequency), the BAW resonator behaves like an inductor. To exploit the series resonance of the BAW resonator in an oscillator, the size of active circuit components (e.g., transistors and metal capacitors) are selected to keep the oscillation frequency as close to the natural series resonance of the BAW resonator as possible since the quality factor of the BAW resonator degrades as one moves away from the natural series resonance. The size of active circuit components is subject to power and area constraints. For example, an active circuit with a very large capacitor will have a distributed inductance which will push the self-resonance frequency (SRF) of the capacitor close to the oscillator frequency, which can lead to design failure. In some example embodiments, capacitor sizes for the active circuit is selected so that the SRF of each capacitor falls below $5*f_{osc}$, where $f_{osc}$ is the oscillation frequency (e.g., 2.5 GHz). The size of transistors for the active circuit is subject to "negative resistance" constraints $$\left(\frac{g_m}{\omega^2 C_1 C_2}\right)$$

used by the active circuit to compensate for the losses in the BAW resonator. This is an iterative process since the transistors will also contribute to the base emitter capacitance in addition to the capacitor added between the base and the emitter.

In some example embodiments, the active circuit 104 may be designed to efficiently compensate for the expected losses of the BAW resonator 108 without negatively affecting desired parameters (such as quality factor) and/or with minimal degradation of parameters such as phase noise or jitter. For the oscillator 102, the combination of the BAW resonator 108 and the active circuit 104 determine the resonant frequencies. For example, the active circuit 104 may couple to the BAW resonator 108 in series or in parallel (shunt) depending on the oscillator topology.

In some example embodiments, the active circuit 104 provides a clocking signal with ultra-low flicker noise performance at close-in frequency offsets (e.g., 10 Hz, 100 Hz, 1 kHz). In the example of FIG. 1, the features include a series resonance topology 106 with: 1) BJTs sized to maximize series capacitance; 2) split common-mode (CM) resonance (e.g., use of a split inductive and resistive degeneration); 3) ESD-compliant bias circuit; 4) the BJTs are R-degeneration NPN devices for improved flicker performance; and 5) a figure eight shape tail inductor for reduced coupling. In other example embodiments, the features of the active circuit 104 may vary. Regarding the first feature (BJTs sized to maximize series capacitance), the BJT size should minimize the series reactance looking into the base terminals. In some example embodiments, selecting the size of the BJT is an iterative process that involves selecting the largest capacitor size for the active circuit that can implemented practically such that the SRF of the capacitors are above a threshold (e.g., $5*f_{osc}$). Next, the effective series resistance ($r_{eff}$, or "effective losses") of the BAW resonator is calculated based on the effective frequency of oscillation given by the resonance frequency of the equivalent BAW inductor ($L_{eff}$) and the previously selected capacitors for the active circuit (whose SRF is above the threshold). Iteration of BJT sizes that satisfy $$\left|\frac{g_m}{\omega^2 C_1 C_2}\right| > r_{eff}$$

is then performed. This is an iterative process since there will be a set of BJT sizes (with variance in length and/or width) that satisfy this constraint. Additionally, each BJT option will add its own intrinsic capacitance between the base emitter junction in addition to the metal capacitors that were selected. The selected BJT size will be dictated by target criteria such as a target phase noise at a given frequency offset. If there are multiple BJT options still available, the most power/area optimal solution may be selected.

This allows the BAW resonator 108 to operate close to its natural series resonance where it exhibits the maximum Q (quality factor). In other words, as the size of the BJT increases, the frequency pulling experienced by the BAW resonator 108 decreases, resulting in a higher Q and lower phase noise. Regarding the fifth feature (a figure eight shape tail inductor), any magnetically isolated shape (e.g., clover shaped inductors) would also work.

In conventional topologies, the inductive degeneration is common to all nodes in an active circuit and is explicitly tuned to the $2^{nd}$ harmonic of the oscillation frequency. In contrast, in the topology of the example embodiments, the DC path is degenerated through a resistor while the frequency determining the alternating current (AC) path is degenerated at a common mode node through an inductor. Accordingly, the CM degeneration inductor does not resonate at the $2^{nd}$ harmonic. Instead, the CM degeneration inductor is used to attain fine phase alignment between emitter and base voltages.

In some example embodiments, the oscillator 102 with the BAW resonator 108 and the active circuit 104 is a type of Clapp or Colpitts oscillator. In some example embodiments, the series resonance topology 106 includes a DC only CM biasing inductor/choke that allows for a single signal ESD for two transistor base terminals. In conventional MEMS series oscillators, the base terminals are resistively biased which adds noise and parasitic shunt loading at the oscillation frequency. In one conventional approach, the inductor whose center tap is used to bias the transistor base terminals is also the primary frequency determining element (oscillating element). In another conventional approach, a microelectromechanical system (MEMS)-based resonator uses the MEMS device as the primary resonance elements and MEMS devices are DC open and thus cannot be used for biasing.

In contrast, in the described topology, an inductor is used as the bias element, which allows a low resistance DC path. Also, the inductor is sized to self-resonate at the oscillation frequency to minimize shunt parasitics. For the oscillator 102, this DC biasing inductor of the active circuit 104 has high-impedance (approaching an open circuit) at the oscillation frequency, thereby having no impact on the oscillation frequency. Additionally, the center tap of the active circuit 104 is connected to a single signal ESD that serves to provide a discharge path through the inductor and ESD protection at any of the two bases to which the BAW resonator 108 is connected. Having a common signal ESD for the active circuit 104 lowers the overall non-linear capacitance connected to the signal nodes in addition to making the active circuit 104 common mode, both of which serve to lower its impact on the flicker performance of the oscillator 102.

In some example embodiments, a transistor collector terminal of the active circuit 104 is used as a common mode node (AC ground) tied to a voltage supply (VDD) Also, the output is tapped directly from the base node (to which the BAW resonator 108 is directly connected). With large devices, the series capacitive reactance associated with the active circuit 104 is lowered, which allows for tapping the signal directly from a transistor base terminal without affecting performance through loading. In contrast, conventional approaches tap the output either from the transistor collector terminal or the transistor emitter terminal.

In some example embodiments, split CM degeneration is used for fine phase alignment between base and emitter terminal voltages as opposed to a basic $2^{nd}$ harmonic resonance. This leads to a superior close-in phase noise improvement (>3 dB) over a common degeneration inductor as done in conventional approaches. Split CM degeneration also provides an additional degree of freedom in the active circuit 104 as the degeneration resistance and inductor sizing expand the potential solution set for optimal performance.

In some example embodiments, use of a DC CM biasing inductor and ESD protection circuitry for the active circuit 104 helps lower the nonlinear capacitance through ESD protection circuitry as well as making the load presented to the circuit by the ESD a common mode load. Use of a DC CM biasing inductor and ESD protection circuitry for the active circuit 104 also allows for ESD compliance without sacrificing any flicker performance due to the non-linear (signal dependent) ESD capacitance. In some example embodiments, the active circuit 104 uses: split inductive and resistive degeneration; DC biasing CM inductor (choke) with a single common ESD; and lower flicker from inherently large BJTs (to limit series capacitive reactance).

Figure 2:
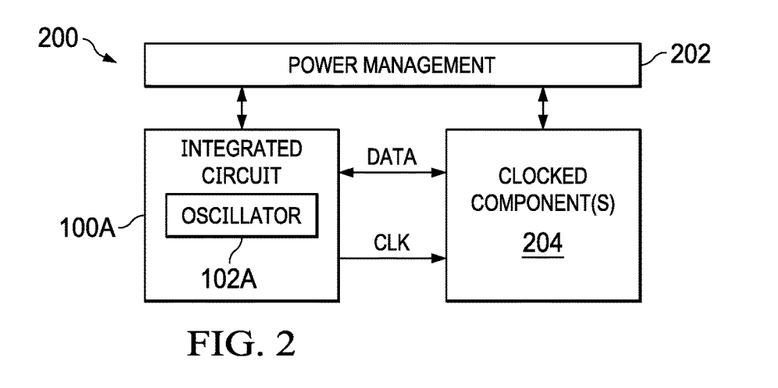
FIG. 2 is a block diagram of a system in accordance with an example embodiment.

FIG. 2 is a block diagram of a system 200 in accordance with an example embodiment. As shown, the system 200 includes an integrated circuit 100A (an example of the integrated circuit 100 in FIG. 1) with an oscillator 102A (an example of the oscillator 102 in FIG. 1). The integrated circuit 100A is coupled to clocked component(s) 204. In the example of FIG. 2, the integrated circuit 100A provides a reference signal (CLK) to the clocked component(s). The CLK is used to support: clock generation; data transfers between the clocked component(s) 204; and/or data transfers between the clocked component(s) 204 and the integrated circuit 100A. As shown, the system 200 also includes power management circuit 202 coupled to and regulating power to the integrated circuit 100A and the clocked component(s) 204. In some example embodiments, the clock signal (CLK) may also be provided to power management circuit 202. In different example embodiments, the system 200 is a communication device, a base station, or other electronic device with high-speed clocks.

Figure 3:
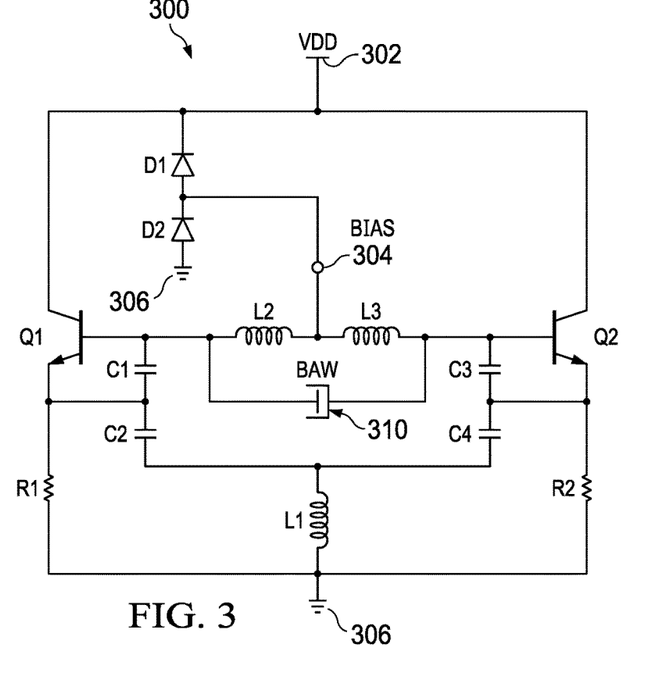
FIG. 3 is a schematic diagram of an oscillator topology in accordance with an example embodiment.

FIG. 3 is a schematic diagram of an oscillator topology 300 in accordance with an example embodiment. As shown, the oscillator topology 300 includes a BAW resonator 310 (an example of the BAW resonator 108 in FIG. 1). The oscillator topology 300 also includes active circuit components (e.g., components of the active circuit 104 in FIG. 1) including a voltage supply (VDD) terminal 302, first and second BJTs Q1 and Q2, a capacitor network (formed by C1, C2, C3 and C4), resistors R1 and R2, inductor L1, and diodes D1 and D2 in the arrangement shown. In the oscillator topology 300, inductors L2 and L3 are part of a biasing network, where L2 and L3 are used as choke inductors. Diodes D1 and D2 are used for ESD protection.

In the example of FIG. 3, Q1 has a first current terminal (e.g., collector of Q1), a second current terminal (e.g., emitter of Q1) and a first control terminal (e.g., base of Q1), the first current terminal coupled to the voltage supply terminal 302, and the control terminal coupled to a first terminal of the BAW resonator 310. Also, Q2 has a third current terminal (e.g., collector of Q2), a fourth current terminal (e.g., emitter of Q2) and a second control terminal (e.g., base of Q2), the third current terminal coupled to the voltage supply terminal 302, and the second control terminal coupled to a second terminal of the BAW resonator 310. In addition, R1 has a first resistor terminal and a second resistor terminal. The first resistor terminal of R1 coupled to the second current terminal, and the second resistor terminal of R1 coupled to a ground terminal 306. R2 has a third resistor terminal and a fourth resistor terminal. The third resistor terminal of R2 coupled to the fourth current terminal, and the fourth resistor terminal of R2 coupled to the ground terminal 306.

As shown, the capacitive network includes a first network terminal (at a first/top terminal of C1) coupled to the first terminal of the BAW resonator 310. The capacitive network also includes a second network terminal (at a second/bottom terminal of C1 and a first/top terminal of C2) coupled to the second current terminal (e.g., the emitter of Q1). The capacitive network further includes a third network terminal (at a second/bottom terminal of C2) coupled to a first inductor terminal (at a first/top terminal of L1). The capacitive network further includes a fourth network terminal (at a first/top terminal of C3) coupled to the second terminal of the BAW resonator 310. The capacitor network also includes a fifth network terminal (at a second/bottom terminal of C3 and at a first/top terminal of C4) coupled to the fourth current terminal (e.g., the emitter of Q1). Moreover, the capacitive network includes a sixth network terminal (at a second/bottom terminal of C4) coupled to the first inductor terminal (at the first/top terminal of L1). In some example embodiments, the capacitive network includes: a first capacitor (e.g., C1) coupled between the first and second network terminals; a second capacitor (e.g., C2) coupled between the second and third network terminals; a third capacitor C3) coupled between the fourth and fifth network terminals; and a fourth capacitor (C4) coupled between the fifth and sixth network terminals.

In some example embodiments, L2 of the oscillator topology 300 has a third inductor terminal (at a first/left terminal of L2) and a fourth inductor terminal (at a second/right terminal of L2. The third inductor terminal is coupled to the first terminal BAW resonator 310, and the fourth inductor terminal is coupled to a bias terminal 304. In some example embodiments, L3 of the oscillator topology 300 has a fifth inductor terminal (at a first/right terminal of L3) and a sixth inductor terminal (at a second/left terminal of L3). The fifth inductor terminal is coupled to the second terminal the BAW resonator 310, and the sixth inductor terminal is coupled to the bias terminal 304.

In some example embodiments, a bias circuit (e.g., RDAC 502 in FIG. 5) is coupled to the bias terminal 304 and is configured to provide a direct current bias to the bias terminal 304. Also, ESD protection circuitry may be coupled to the bias terminal 304. In some example embodiments, the ESD protection circuitry includes a first diode (e.g., D1 in FIG. 3) having a first anode and a first cathode. The first anode is coupled to the bias terminal 304, and the first cathode coupled to the voltage supply terminal 302. The ESD protection circuitry also includes a second diode (e.g., D2) having a second anode and a second cathode. The second cathode is coupled to the bias terminal 304, and the second anode is coupled to the common voltage potential (e.g. ground terminal) 306.

Figure 4:
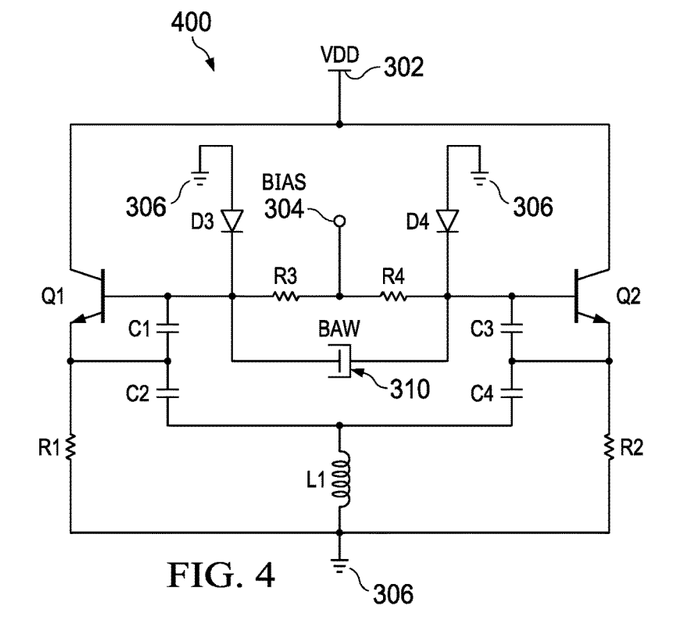
FIG. 4 is a schematic diagram of another oscillator topology in accordance with an example embodiment.

FIG. 4 is a schematic diagram of another oscillator topology 400 in accordance with an example embodiment. As shown, the oscillator topology 400 of FIG. 4 includes many of the same components as the oscillator topology 300 of FIG. 3, including the BAW resonator 310 (an example of the BAW resonator 108 in FIG. 1) and active circuit components (e.g., components of the active circuit 104 in FIG. 1). The active circuit components of the oscillator topology 400 include: the voltage supply terminal 302, Q1 and Q2, a capacitor network formed by C1-C4, R1, R2, and L1 in the same arrangement shown for the oscillator topology 300 of FIG. 3. In some example embodiments, the outputs of the oscillator topology 400 are at (tapped from) the base terminals of Q1 and Q2. This would be the same as tapping at the terminals of the BAW resonator 310 or at the bond wires between the base terminals of Q1 and Q2 and respective terminals of the BAW resonator 310. In other example embodiments, the outputs of the oscillator topology 400 are at (tapped from) the emitter terminals of Q1 and Q2. The difference between these output options is the size of the AC coupling capacitor that couples the oscillator to a buffer (the AC coupling capacitor and buffer are not shown), which provides the final output of the oscillator.

In the oscillator topology 400, resistor R3 replaces L2, and resistor R4 replaces L3. Specifically R3 has a fifth resistor terminal and a sixth resistor terminal. The fifth resistor terminal is coupled to the first BAW resonator terminal, and the sixth resistor terminal is coupled to a bias terminal. Also, R4 has a seventh resistor terminal and an eighth resistor terminal. The seventh resistor terminal is coupled to the second BAW resonator terminal, and the eighth resistor terminal is coupled to the bias terminal.

Also, the oscillator topology 400 includes ESD protection circuitry at the control (base) terminals of Q1 and Q2. The ESD protection circuitry of the oscillator topology 400 includes the diodes D3 and D4. As shown, D3 includes a cathode coupled to the control terminal of Q1, and an anode coupled to the ground 306. D4 includes a cathode coupled to the control terminal of Q2, and an anode coupled to the ground 306.

In some example embodiments, D3 and D4 are base-collector (BC) junctions to prevent against positive ESD events (spikes) through the BC pn junctions. In such case, a path is provided only for negative ESD events. For the oscillator topology 400, Q1 and Q2 cannot be used to effectively counter ESD events due to emitter degeneration resistance limiting the conductivity. By design, Q1 and Q2 are much bigger than a diode size required to support machine model (MM) ESD events (MM ESD events emulate ESD events caused by automated machine handling of ICs), thereby allowing for absorption of the relatively small non-linear ESD capacitance. In some example embodiments, the size of the ESD is emulated as the smallest diode size that satisfies the charge/discharge criterion for a machine model event. It varies slightly from one technology node to the other, but this diode size has no correlation to the actual BJT size in the oscillator. Likewise, the ESD capacitance will depend on the size of the ESD diode (again, not controlled by the designer).

Figure 5:
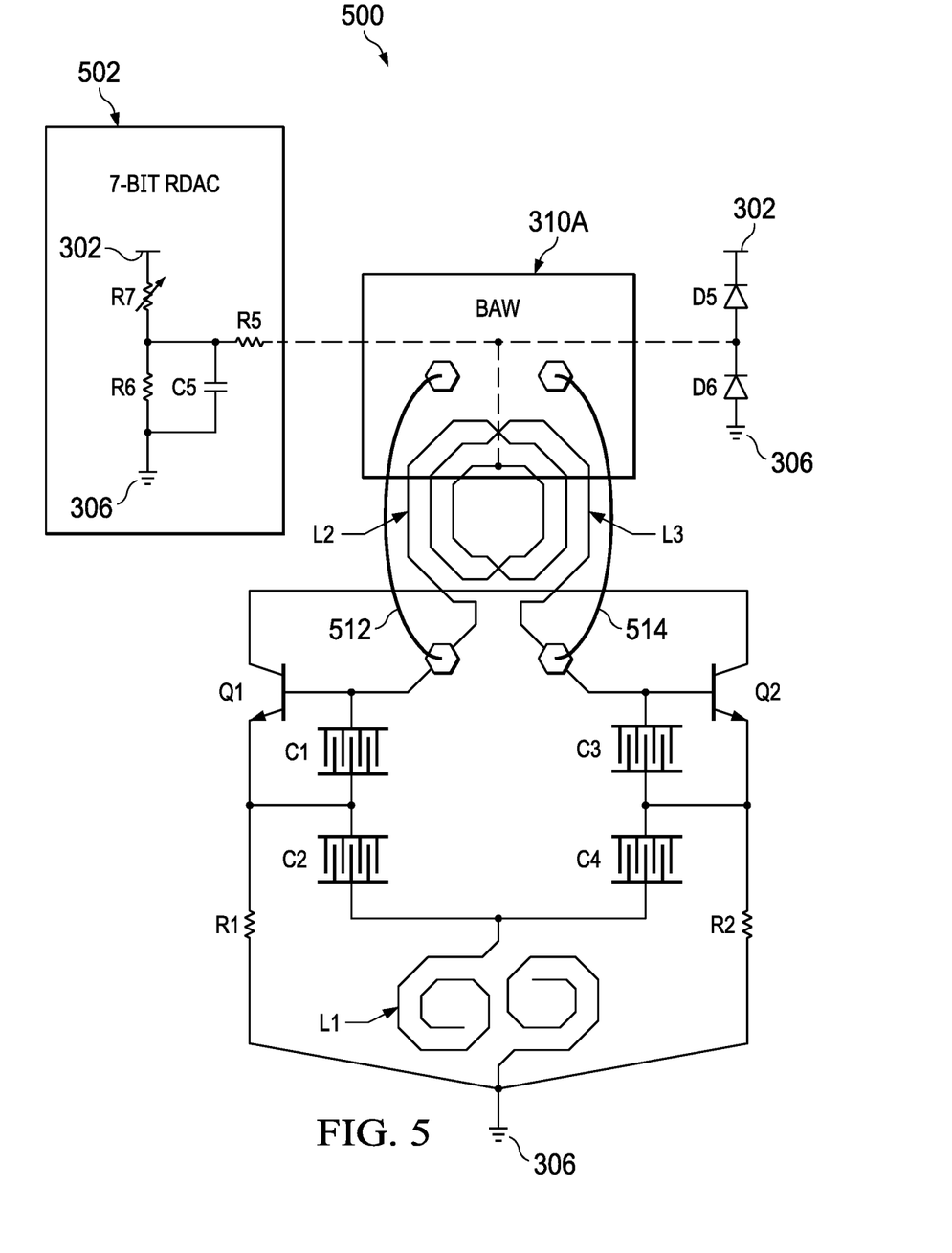
FIG. 5 is a schematic diagram of another oscillator topology in accordance with an example embodiment.

FIG. 5 is a schematic diagram of another oscillator topology 500 in accordance with an example embodiment. As shown, the oscillator topology 500 of FIG. 5 includes many of the same components as the oscillator topology 300 of FIG. 3, including a BAW resonator 310A (an example of the BAW resonator 108 in FIG. 1, or the BAW resonator 310 in FIG. 3) and active circuit components (e.g., components of the active circuit 104 in FIG. 1). The active circuit components of the oscillator topology 500 include: the voltage supply terminal 302, Q1 and Q2, a capacitor network formed by C1-C4, R1, R2, L1-L3 in the same arrangement shown for the oscillator topology 300 of FIG. 3. Also, wires 512 and 514 are coupled between the BAW resonator 310A and traces coupled to respective transmitter base terminals of Q1 and Q2. In some example embodiments, the outputs of the oscillator topology 500 are at (tapped from) the base terminals of Q1 and Q2. This would be the same as tapping at the terminals of the BAW resonator 310A or at the bond wires 512 and 514 between the base terminals of Q1 and Q2 and respective terminals of the BAW resonator 310A. In other example embodiments, the outputs of the oscillator topology 500 are at (tapped from) the emitter terminals of Q1 and Q2. The difference between these output options is the size of the AC coupling capacitor that couples the oscillator to a buffer (the AC coupling capacitor and buffer are not shown), which provides the final output of the oscillator.

In the oscillator topology 500, example structures for C1-C4 and L1-L3 are given. More specifically, L1 has a figure eight shape, L2 has a C shape, and L3 has a reverse C shape. Also, in some example embodiments, each of C1-C4 are metal-oxide metal (MOM) capacitors (sometimes referred to as finger caps). In the example of FIG. 5, the BAW resonator 310A is coupled to a bias circuit 502 (e.g., a 7-bit resistive digital-to-analog converter or RDAC). The bias circuit 502 includes resistors R5-R7 and a capacitor C5 in the arrangement shown with R7 and R6 in series between the voltage supply terminal 302 and the ground terminal 306. As shown, R7 is a variable resistor in FIG. 5. Also, R5 is coupled between the BAW resonator 310A and the connection between R6 and R7. Further, C5 is coupled between the ground node 306 and the connection between R7 and R6.

Also, the oscillator topology 500 includes ESD protection circuitry coupled to the BAW resonator 310A. The ESD protection circuitry of the oscillator topology 500 includes the diodes D5 and D6. As shown, D5 includes a cathode coupled to the voltage supply terminal 302, and an anode coupled to the BAW resonator 310A. D6 includes a cathode coupled to the BAW resonator 310A, and an anode coupled to the ground terminal 306.

The oscillator topology 500 includes various features to improve phase noise performance at close-in offsets. The features include: a split-CM resonance (L2 and L3); an ESD-compliant (due to D1 and D2) CM inductive bias (the 7-bit RDAC 502 coupled to D1 and D2); R-degeneration NPNs (Q1 and Q2) for improved flicker performance; and a figure eight shape tail inductor (L1) for reduced coupling. In some example embodiments, the bias can be brought in through an resistive DAC (RDAC), or a current DAC (IDAC) pumping current directly into the base terminal or by pumping current into a diode-connected MOSFET. There are many possible ways to provide the bias, and the described topologies are compatible with all such biasing schemes.

Figure 6:
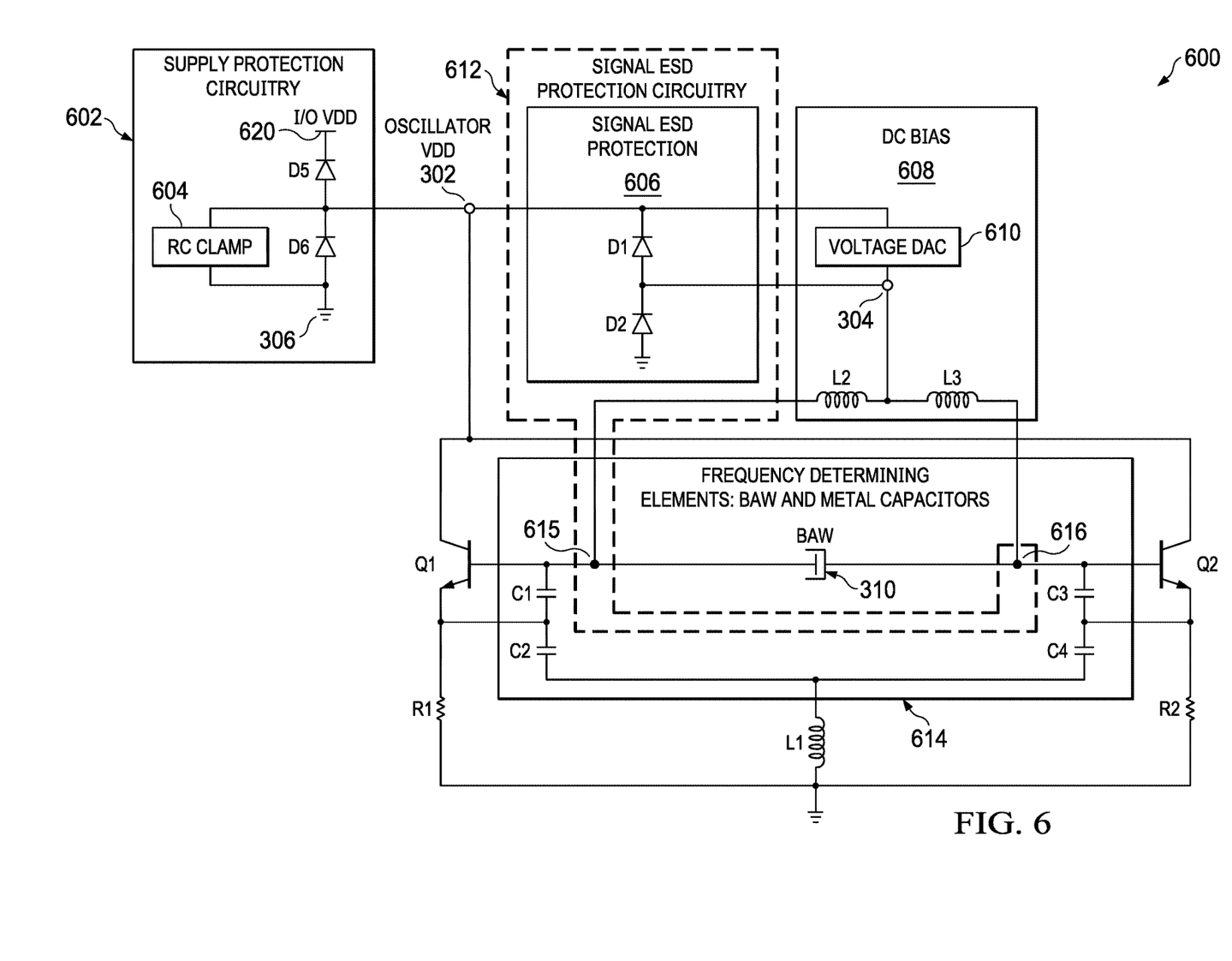
FIG. 6 is a schematic diagram of another oscillator topology in accordance with an example embodiment.

FIG. 6 is a schematic diagram of another oscillator topology 600 in accordance with an example embodiment. As shown, the oscillator topology 600 of FIG. 6 includes many of the same components as the oscillator topology 300 of FIG. 3, including the BAW resonator 310 and active circuit components (e.g., components of the active circuit 104 in FIG. 1). The active circuit components of the oscillator topology 600 include: the voltage supply terminal 302, Q1 and Q2, a capacitor network formed by C1-C4, R1, R2, L1 in the same arrangement shown for the oscillator topology 300 of FIG. 3. Also, the biasing network formed by L2 and L3 is included in the oscillator topology 600. In some example embodiments, the outputs of the oscillator topology 600 are at (tapped from) the base terminals of Q1 and Q2. This would be the same as tapping at the terminals of the BAW resonator 310 or at the bond wires between the base terminals of Q1 and Q2 and respective terminals of the BAW resonator 310. In other example embodiments, the outputs of the oscillator topology 600 are at (tapped from) the emitter terminals of Q1 and Q2. The difference between these output options is the size of the AC coupling capacitor that couples the oscillator to a buffer (the AC coupling capacitor and buffer are not shown), which provides the final output of the oscillator.

In the oscillator topology 600, the BAW resonator 310 and C1-C4 are identified as frequency determining elements 614. Also, the signal pads 615 and 616 coupled to the terminals of the BAW resonator 310 are ESD protected by ESD protection circuitry 612 coupled to the bias terminal 304. The ESD protection circuitry 612 includes D1 and D2 in the same arrangement described for FIG. 3. In the example of FIG. 6, a voltage DAC 610 is used as a DC bias source 608. In some example embodiments, voltage DAC 610 does not affect the oscillation frequency. The frequency is determined by C1-C4 and BAW 310.

As shown, the oscillator topology 600 also includes supply protection circuitry 602 with a resistor-capacitor (RC) clamp 604 and ESD protection circuitry including diodes D5 and D6. More specifically, the cathode of D5 is coupled to a second voltage supply (I/O VDD) terminal 620, and the anode of D5 is coupled to the voltage supply terminal 302. Also, the cathode of D6 is coupled to the voltage supply terminal 302, and the anode of D6 is coupled to the ground terminal 306.

With the oscillator topology 600, a CM inductor (L2 or L3) is driven by the voltage DAC 610 for DC biasing only (without affecting the oscillation frequency). Also, the CM inductor (L2 or L3) provides a common ESD path for the signal pads 615 and 616 coupled to terminals of the BAW resonator 310 and the control terminals of Q1 and Q2 (NPN BJTs).

With the oscillator topologies 300, 400, 500, and 600, close-in (flicker region) phase noise performance of an oscillator with BAW resonator is improved through a combination of device degeneration and tail filtering. In some example embodiments, ESD compliance may be achieved, without any performance penalty, through inductive base biasing as described for oscillator topologies 300, 500, and 600 of FIGS. 3, 5, and 6. The CM biasing inductor should be as large as possible and can operate beyond its self-resonant frequency (SRF) at the frequency of interest since its only for DC biasing and should present as high an impedance as possible at the oscillation frequency. The tail inductor (L1 in the oscillator topologies 300, 400, 500, and 600) is used for fine phase alignment between the base and the collector voltages. The tail inductor differs from a regular choke or $2^{nd}$ harmonic inductor since its always shunted by the small emitter degeneration resistor (R1 or R2 in the oscillator topologies 300, 400, 500, and 600). With the tail inductor (L1, also referred to as Ldegen herein), the oscillator topologies 300, 400, 500, and 600 are also less sensitive to ground parasitic inductance compared to other oscillator topologies.

Figure 7:
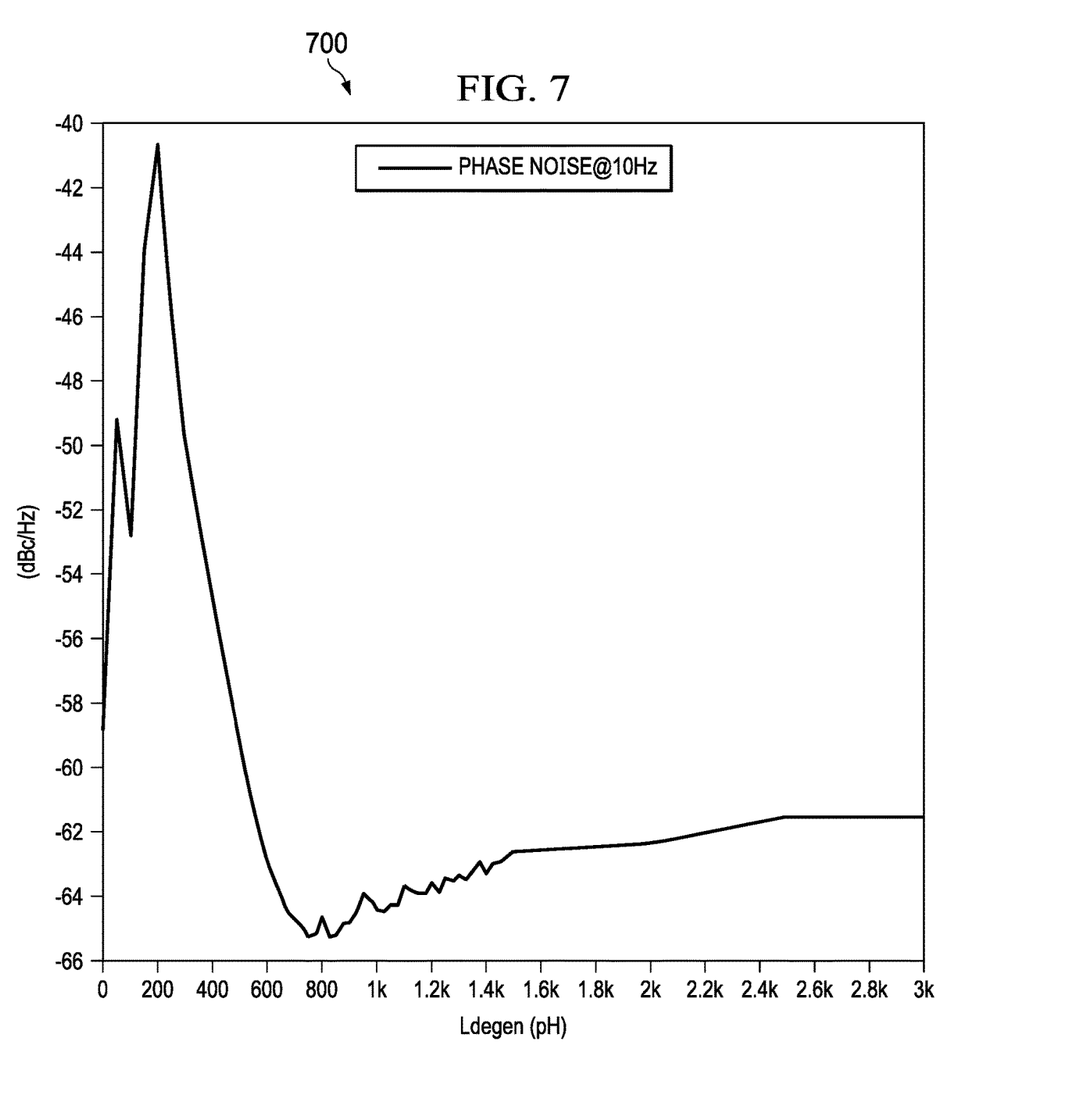
FIG. 7 is a graph of phase noise as a function of inductance in accordance with an example embodiment.

FIG. 7 is a graph 700 of phase noise at the oscillator outputs (e.g., the output of an output buffer for the related oscillator) as a function of tail inductance Ldegen (e.g., L1) in accordance with an example embodiment. For the graph 700, phase noise (in dB relative to the magnitude of the center signal/Hz) at 10 Hz offset is assumed. The graph 700 indicates an optimal inductance value for phase alignment between base and emitter signals, leading to improved flicker noise suppression. As shown, the phase noise is at a minimum when inductance of the tail inductor (Ldegen) is around 800 pH. In some example embodiments, the value of L1 (Ldegen) in an oscillator topology such as the oscillator topologies 300, 400, 500, and 600 is selected to minimize phase noise.

Figure 8:
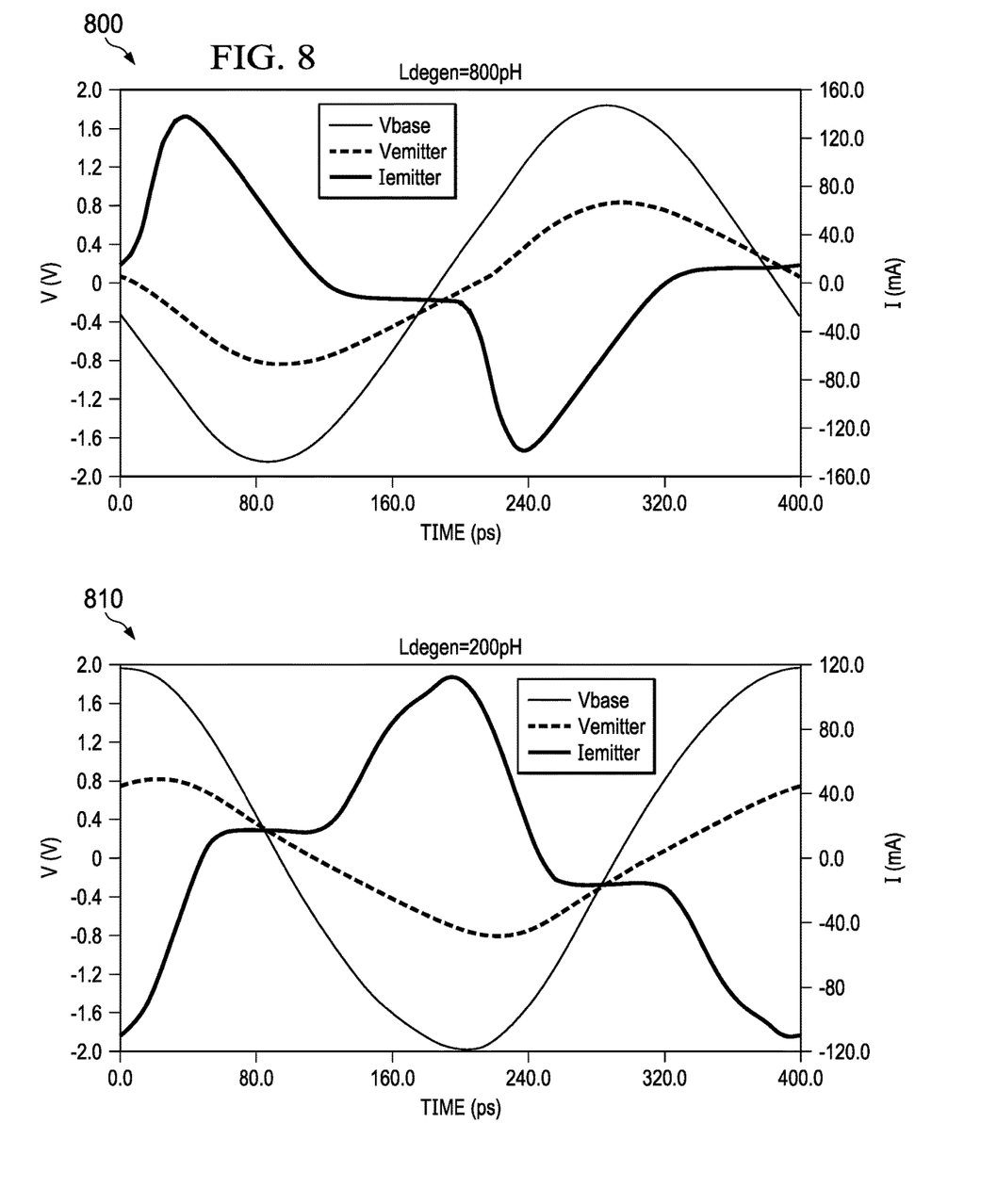
FIG. 8 is graphs of voltage as a function of time for transistor terminals of an oscillator topology in accordance with different examples.

FIG. 8 is graphs 800 and 810 of voltage as a function of time for transistor terminals (since the active circuit is a symmetric circuit, the graphs 800 and 810 are for the base and emitter voltages of either of Q1 or Q2) of an oscillator topology in accordance with different examples. In graphs 800, a value of 800 pH is assumed for L1 (Ldegen). In graph 810, a value of 200 pH is assumed for L1 (Ldegen). As indicated in graph 800, there is an optimum value of the CM inductance at which the base and emitter signals are in phase at which point, resulting in maximum flicker suppression and minimum close-in phase noise.

Figure 9:
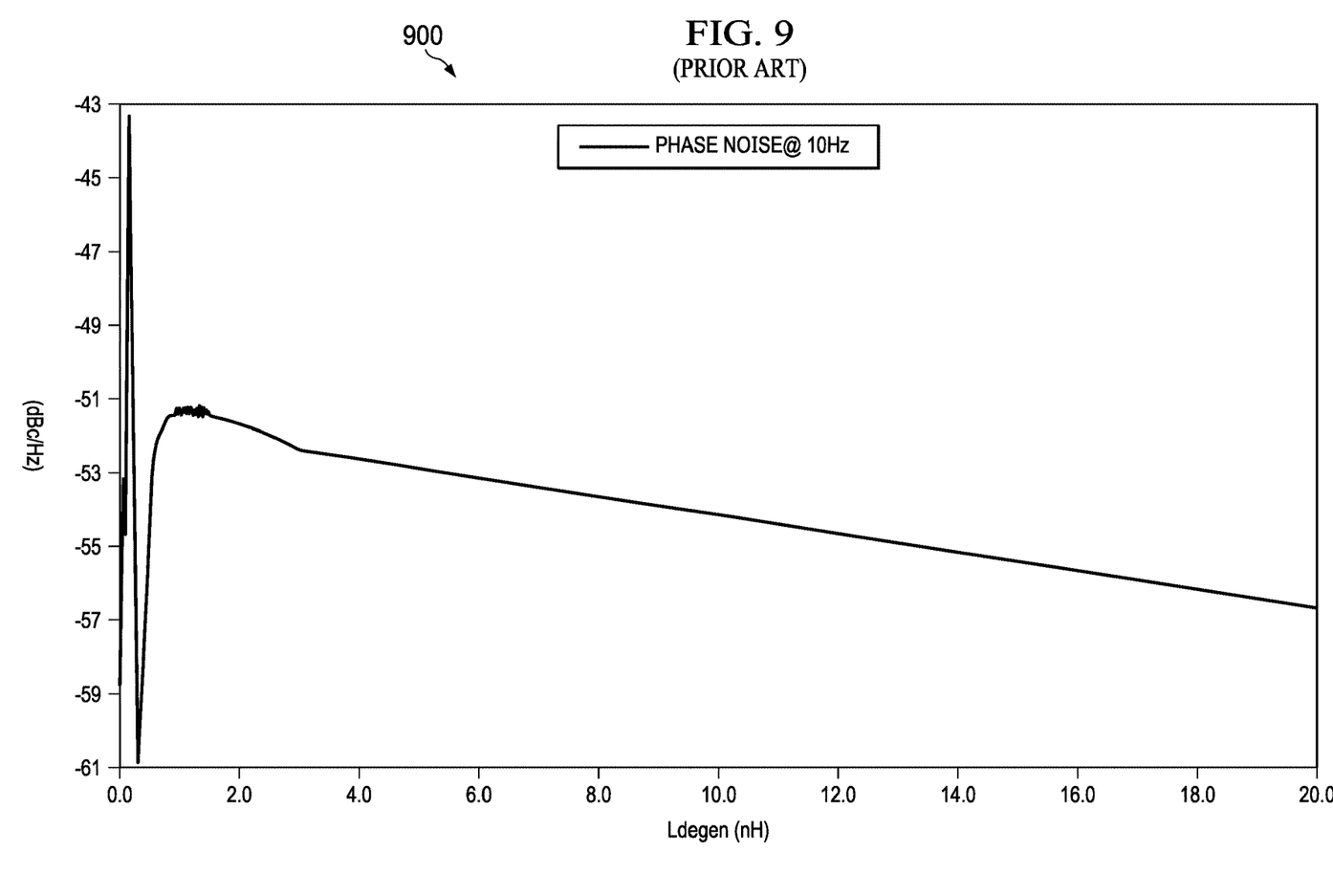
FIG. 9 is a graph of phase noise as a function of inductance in accordance with a conventional approach.

FIG. 9 is a graph 900 of phase noise at the oscillator outputs (e.g., the output of an output buffer for the related oscillator) as a function of tail inductance Ldegen (e.g., L1) in accordance with a conventional approach. In graph 900, phase noise at a 10 Hz offset is assumed. Compared to graph 700, the graph 900 suggests use of a smaller inductance to reduce phase noise. Also, the graph 900 indicates the lowest phase noise performance is above −61 dBc/Hz, which is approximately 4 dB worse than phase noise performance of the described oscillator topologies (e.g., the oscillator topologies 300, 500, and 600).

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

As used herein, the terms "terminal", "node", "interconnection", "pin" are used interchangeably. Unless specifically stated to the contrary, these terms are generally used to mean an interconnection between or a terminus of a device element, a circuit element, an integrated circuit, a device or other electronics or semiconductor component.

While the example embodiments above utilize NPN bipolar junction transistors (BJTs), other example embodiments may utilize PNP BJTs, n-channel metal-oxide-silicon field-effect transistors (nMOSFET), p-channel MOSFETs or any other type of transistor. Hence, when referring to a current terminal, such terminal may be an emitter, collector, source or drain. In addition, the control terminal may be a base or a gate. In addition, the diodes of the example embodiments may include any type of diode or diode-connected transistors.

Modifications are possible in the described embodiments, and other embodiments are possible, within the scope of the claims.

What is claimed is:

1. An oscillator, comprising:
   a bulk-acoustic wave (BAW) resonator having a first BAW resonator terminal and a second BAW resonator terminal;
   an active circuit coupled to the first and second BAW resonator terminals and having a series resonance topology with:
      a first transistor having a first current terminal, a second current terminal and a first control terminal, the first current terminal coupled to a voltage supply terminal, and the first control terminal coupled to the first BAW resonator terminal;
      a second transistor having a third current terminal, a fourth current terminal and a second control terminal, the third current terminal coupled to the voltage supply terminal, and the second control terminal coupled to the second BAW resonator terminal;
      a first resistor having a first resistor terminal and a second resistor terminal, the first resistor terminal coupled to the second current terminal, and the second resistor terminal coupled to a ground terminal;
      a second resistor having a third resistor terminal and a fourth resistor terminal, the third resistor terminal coupled to the fourth current terminal, and the fourth resistor terminal coupled to the ground terminal;
      a capacitive network coupled to the first and second BAW resonator terminals, the second current terminal, and the fourth current terminal; and
      an inductor having a first inductor terminal and a second inductor terminal, the first inductor terminal coupled to the capacitive network, and the second inductor terminal coupled to the ground terminal; and
   an inductive bias network coupled to the first and second BAW resonator terminals and to the first and second control terminals.

2. The oscillator of claim 1, wherein the capacitive network includes a first network terminal, a second network terminal, a third network terminal, a fourth network terminal, and a fifth network terminal, the first network terminal coupled to the first BAW resonator terminal, the second network terminal coupled to the second current terminal, the third network terminal coupled to the first inductor terminal, the fourth network terminal coupled to the second BAW resonator terminal, and the fifth network terminal coupled to the fourth current terminal.

3. The oscillator of claim 2, wherein the capacitive network includes:
   a first capacitor coupled between the first and second network terminals;
   a second capacitor coupled between the second and third network terminals;
   a third capacitor coupled between the fourth and fifth network terminals; and
   a fourth capacitor coupled between the fifth and third network terminals.

4. The oscillator of claim 1, wherein the inductor is a first inductor, and the inductive bias network comprises:
   a second inductor having a third inductor terminal and a fourth inductor terminal, the third inductor terminal coupled to the first BAW resonator terminal, and the fourth inductor terminal coupled to a bias terminal; and
   a third inductor having a fifth inductor terminal and a sixth inductor terminal, the fifth inductor terminal coupled to the second BAW resonator terminal, and the sixth inductor terminal coupled to the bias terminal.

5. The oscillator of claim 4, further comprising:
   a bias circuit coupled to the bias terminal and configured to provide a direct current bias to the bias terminal; and
   electrostatic discharge (ESD) protection circuitry coupled to the bias terminal.

6. The oscillator of claim 5, wherein the ESD protection circuitry includes:
   a first diode having a first anode and a first cathode, the first anode coupled to the bias terminal, and the first cathode coupled to voltage supply terminal; and
   a second diode having a second anode and a second cathode, the second cathode coupled to the bias terminal, and the second anode coupled to the ground terminal.

7. The oscillator of claim 1, wherein the first and second transistors are NPN bipolar junction transistors and the active circuit includes:
   a split common-mode (CM) resonance; and
   an electrostatic discharge (ESD) protected common-mode inductive bias.

8. The oscillator of claim 1, wherein the inductor has a figure eight shape.

9. The oscillator of claim 1, further comprising:
a voltage supply protection circuit coupled to the voltage supply terminal; and
a clamp circuit coupled between the voltage supply terminal and the ground terminal.

10. A system, comprising:
circuitry having a clock input; and
an oscillator having a clock output coupled to the clock input of the circuitry, the oscillator having:
  a bulk-acoustic wave (BAW) resonator having a first BAW resonator terminal and a second BAW resonator terminal;
  an active circuit coupled to the first and second BAW resonator terminals and having a series resonance topology with:
    a first transistor having a first current terminal, a second current terminal and a first control terminal, the first current terminal coupled to a voltage supply terminal, and the control terminal coupled to the first BAW resonator terminal;
    a second transistor having a third current terminal, a fourth current terminal and a second control terminal, the third current terminal coupled to the voltage supply terminal, and the second control terminal coupled to the second BAW resonator terminal;
    a first resistor having a first resistor terminal and a second resistor terminal, the first resistor terminal coupled to the second current terminal, and the second resistor terminal coupled to a ground terminal;
    a second resistor having a third resistor terminal and a fourth resistor terminal, the third resistor terminal coupled to the fourth current terminal, and the fourth resistor terminal coupled to the ground terminal;
    a capacitive network coupled to the first and second BAW resonator terminals, the second current terminal, and the fourth current terminal; and
    an inductor having a first inductor terminal and a second inductor terminal, the first inductor terminal coupled to the capacitive network, and the second inductor terminal coupled to ground terminal; and
  an inductive bias network coupled to the first and second BAW resonator terminals and to the first and second control terminals.

11. The system of claim 10, wherein the capacitive network includes a first network terminal, a second network terminal, a third network terminal, a fourth network terminal, and a fifth network terminal, the first network terminal coupled to the first BAW resonator terminal, the second network terminal coupled to the second current terminal, the third network terminal coupled to the first inductor terminal, the fourth network terminal coupled to the second BAW resonator terminal, and the fifth network terminal coupled to the fourth current terminal.

12. The system of claim 11, wherein the capacitive network includes:
a first capacitor coupled between the first and second network terminals;
a second capacitor coupled between the second and third network terminals;
a third capacitor coupled between the fourth and fifth network terminals; and
a fourth capacitor coupled between the fifth and third network terminals.

13. The system of claim 10, wherein the inductor is a first inductor, and the inductive bias network includes:
a second inductor having a third inductor terminal and a fourth inductor terminal, the third inductor terminal coupled to the first BAW resonator terminal, and the fourth inductor terminal coupled to a bias terminal; and
a third inductor having a fifth inductor terminal and a sixth inductor terminal, the fifth inductor terminal coupled to the second BAW resonator terminal, and the sixth inductor terminal coupled to the bias terminal.

14. The system of claim 13, further comprising:
a bias circuit coupled to the bias terminal and configured to provide a direct current bias to the bias terminal; and
electrostatic discharge (ESD) protection circuitry coupled to the bias terminal.

15. The system of claim 10, wherein the first and second transistors are NPN bipolar junction transistors (BJTs), and the active circuit includes:
a split common-mode (CM) resonance; and
an electrostatic discharge (ESD) protected common-mode inductive bias.

16. The system of claim 10, wherein the inductor has a figure eight shape.

17. The system of claim 10, wherein the oscillator is implemented on a single semiconductor die.

18. An oscillator, comprising:
a bulk-acoustic wave (BAW) resonator having a first BAW resonator terminal and a second BAW resonator terminal;
an active circuit coupled to the first and second BAW resonator terminals and having a series resonance topology with:
  a first transistor having a first current terminal, a second current terminal and a first control terminal, the first current terminal coupled to a voltage supply terminal, and the first control terminal coupled to the first BAW resonator terminal;
  a second transistor having a third current terminal, a fourth current terminal and a second control terminal, the third current terminal coupled to the voltage supply terminal, and the second control terminal coupled to the second BAW resonator terminal;
  a first resistor having a first resistor terminal and a second resistor terminal, the first resistor terminal coupled to the second current terminal, and the second resistor terminal coupled to a ground terminal;
  a second resistor having a third resistor terminal and a fourth resistor terminal, the third resistor terminal coupled to the fourth current terminal, and the fourth resistor terminal coupled to the ground terminal;
  a capacitive network coupled to the first and second BAW resonator terminals, the second current terminal, and the fourth current terminal; and
  an inductor having a first inductor terminal and a second inductor terminal, the first inductor terminal coupled to the capacitive network, and the second inductor terminal coupled to the ground terminal; and
a resistive bias network coupled to the first and second BAW resonator terminals, to the first and second control terminals and to a bias terminal.

19. The oscillator of claim 18, wherein the resistive bias network includes:
a third resistor having a fifth resistor terminal and a sixth resistor terminal, the fifth resistor terminal coupled to the first BAW resonator terminal, and the sixth resistor terminal coupled to the bias terminal; and a fourth resistor having a seventh resistor terminal and an eighth resistor terminal, the seventh resistor terminal coupled to the second BAW resonator terminal, and the eighth resistor terminal coupled to the bias terminal.

20. The oscillator of claim 18, further comprising:

first and second diodes, the first diode having a first cathode coupled to the first BAW resonator terminal and a first anode coupled to the ground terminal, and the second diode having a second cathode coupled to the second BAW resonator terminal and a second anode coupled to the ground terminal.

\* \* \* \* \*